United States Patent Office 3,741,858

Patented June 26, 1973

3,741,858

PRINTED CIRCUIT BOARD

Yoshio Fujiwara, Keiichi Naito, and Toru Odajima, Tochigi-ken, Japan, assignors to Sony Corporation, Tokyo, Japan No Drawing. Filed Aug. 9, 1971, Ser. No. 170,334
Claims priority, application Japan, Aug. 10, 1970, 45/69,286
Int. Cl. B32b *5/02, 15/08, 15/14*
U.S. Cl. 161—185 6 Claims

ABSTRACT OF THE DISCLOSURE

A printed circuit board including an epoxy resin impregnated glass fiber board and a copper foil laminated thereon with an adhesive is shown. The adhesive is comprised of a phenoxy resin, a low molecular epoxy resin and a cross-linking agent therebetween.

This invention relates to a printed circuit board, and more particularly to an adhesive for laminating a metal foil onto an epoxy resin impregnated glass fiber plate.

In the prior art, a copper clad printed circuit board is produced by placing a treated electrolytic copper foil directly on an epoxy glass fiber board of NEMA G–10 grade or MIL GE grade without an adhesive. Where the application does not require a circuit board having the best characteristics, the copper foil is bonded to the glass board with an adhesive.

The copper clad, epoxy glass board produced without adhesive is excellent in electrical characteristics and in chemical resistance but, as compared with boards manufactured with an adhesive, they have defects such as poor adhesion, low productivity, resulting from difficulties in handling, and brown spots or stains caused by chemical reaction of the impregnated resin with the treated surface of the copper foil after the latter is etched or reprint of a copper oxide layer on the board after etching.

The copper clad glass board with a polyvinylacetal-phenol system resin, polyurethane-epoxy system adhesive, nylon-phenol system adhesive or the like is free from such defects, but it is poor in chemical resistance and in electric characteristics and hence is restricted in application and in etching or soldering process.

The epoxy resin is known to be excellent in chemical resistance, in electric characteristics and in adhesion to metal when employed as an adhesive. However, when used as an adhesive, the epoxy resin has excellent shear strength but poor peel strength. The strength of the bond of the copper foil to the impregnated resin for the printed circuit board is standardized according to peel strength.

The chemical resistance of the copper clad glass board is a resistance to the chemicals used to etch the copper foil. At present, etching is usually achieved with an etchant such as an aqueous solution of ferric chloride or ammonium persulfate or sulfuric-chromic acid mixture. The etchant is selected for a particular purpose. In the case of through-hole plating of the copper clad glass board, the board is plated with a metal other than copper and subjected to etching to remove unnecessary portions of the copper foil. In this case, when the glass board is finished with gold plating or tin-nickel plating, a solution of ferric chloride is employed and when the board is finished with solder plating or tin plating a solution of ammonium persulfate or sulfuric-chromic acid mixture is used. The aforementioned adhesives have no resistance, particularly to sulfuric-chromic acid mixture and they dissolve therein. In the manufacture of multi-layer boards a strong acid such as fluohydric acid is used for a short time to facilitate the through-hole plating and the conventional adhesives are also not resistant to this acid. Other various chemicals are used in the fabrication of the printed circuit board but no adhesive has yet been discovered which is resistant to the chemicals represented by the aforementioned ones and which is excellent in bond strength and particularly in peel strength.

The object of the present invention is to provide an adhesive which is comprised of a phenoxy resin, a low molecular epoxy resin having an epoxy value of less than 4,000 and a cross-linking agent having at least two aziridine rings (ethylene imine rings) at the ends of molecules thereof or a cross-linking agent which is a chelate of an organic metal compound.

This adhesive is most suitable for laminating a metal foil on an epoxy resin impregnated glass fiber board or a prepreg and has excellent heat and chemical resistance and a strong bond strength. The adhesive of this invention is not limited specifically to use in the manufacture of the printed circuit specifically to use in the manufacture of the printed circuit board but may be used as a structural adhesive in the manufacture of, for example, airplanes which requires excellent bond strength at high temperature. The adhesive may be directly coated and semicured on the surace to be bonded but it is possible to prepare a bonding sheet produced by impregnating and semicuring the adhesive on a glass fiber cloth or produced by semicuring the adhesive in film form, insert it between a metal foil and a prepreg and heat and pressurize the overall structure to provide a laminated printed circuit board. The adhesive for the bonding sheet, if heated, will become a liquid, then a gel and finally fully polymerized. This thermally set adhesive or resin cannot be liquefied again by heat. This semicured adhesive or resin is called B-stage material.

This principal component of the adhesive employed in the present invention is a phenoxy resin having the following formula:

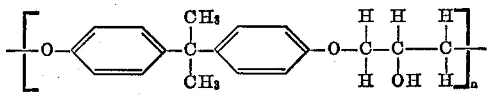

wherein *n* is about 50 to 100.

The phenoxy resin is generally excellent, as an adhesive, in adhesion, in chemical resistance and in shock resistance. However, since the phenoxy resin is thermoplastic, it has a melting point of about 100° C. and cannot withstand temperatures of approximately 260° C. in the soldering step. Further, an adhesive for the printed circuit board must have excellent bond strength, chemical resistance and electric characteristics previously described. It has been found that these requirements are well satisfied by adding to the phenoxy resin a cross-linking agent, so that the principal component, the phenoxy resin forms a cross-linked structure after bonding.

The epoxy value of an epoxy resin impregnated in a glass fiber board of type G–10 or G–11 is usually lower than about 500. The phenoxy resin used in the present invention is a high molecular weight compound in which *n* is about 50 to 100 according to the aforementioned formula, so that even if a metal foil, for example, a copper foil is bonded to an epoxy resin impregnated glass fiber board with the phenoxy resin, the phenoxy resin is poor in compatibility with the impregnated epoxy resin because of its poor flow characteristic. In order to compensate for this, the present invention employs a low molecular weight epoxy resin which is blended.

The low molecular weight epoxy resin is preferred to have an epoxy value of less than 4000 and may be bisphenol A type epoxy resin, epoxy novolak resin now on the market or an epoxy resin such as Unox Epoxide 201 (trademark). These resins have more than two epoxy groups and exhibit excellent flow characteristics when heated up to about 160° C., so that they are suitable for the purpose. The amount of the low molecular weight epoxy resin to be added to the phenoxy resin is preferred to be 20 to 400% by weight with respect to the latter. Reducing the amount of low molecular weight epoxy resin to less than 20% with respect to the phenoxy resin causes flow of the adhesive to become poor, and hence prevents complete cross-linking, resulting in lowering of the heat resistance of the adhesive. On the other hand, with more than 400% of the low molecular weight epoxy resin, desired bond strength cannot be obtained.

The phenoxy resin and the low molecular weight epoxy resin are difficult to react directly with each other to provide an adhesive layer of high cross-linking density, so a cross-linking agent is required.

Typical cross-linking agents are compounds having more than two aziridine rings at the end of the molecules thereof, such as are represented by the following:

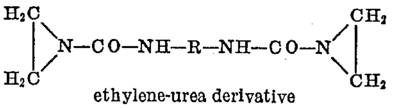

ethylene-urea derivative

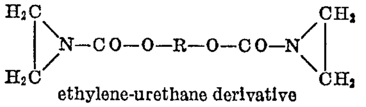

ethylene-urethane derivative

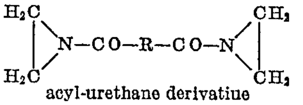

acyl-urethane derivatiue in which R is an aliphatic or aromatic group. Atoms such as phosphor and sulfur may be included. Each of these compounds having the aziridine rings serves as a hardener of the epoxy resin and, at the same time, reacts with active hydrogen such as a hydroxyl group OH and a carboxyl group COOH. Accordingly, each compound simultaneously reacts with both of the phenoxy resin having the hydroxyl group OH and the low molecular epoxy resin to provide an adhesive layer of high cross-linking density. Since the reaction activating temperature of the aziridine rings is higher than room temperature, an adhesive supplemented with the above-mentioned cross-linking agent is highly stable at normal temperature, but it is easy to impart suitable cross-linking density to the adhesive by coating the adhesive on a metal foil such as a copper foil and semicuring the adhesive. Where the adhesive coated copper foil is laminated on an epoxy resin impregnated glass fiber board or prepreg, if the semicuring of the adhesive is insufficient, i.e. if the degree of cross-linking is too low, the impregnated resin flows into the adhesive layer and reaches the surface of the copper foil and lowers the bond strength between copper foil and adhesive. Where the degree of cross-linking obtained by semicuring the adhesive is too high, migration of the adhesive and the resin of the prepreg is poor and causes incomplete bonding of the copper foil and the prepreg. It is thus desirable to provide suitable cross-linking density by semicuring the adhesive. For the above reasons, the cross-linking agent is preferred to be heat reactive.

The amount of the cross-linking agent having the aziridine rings is preferred to be 2 to 30% by weight relative to the phenoxy resin. An amine resin may be used for adjustment of the curing velocity. The amount of the amine resin is preferred to be 5 to 30% by weight relative to the phenoxy resin. In either case, when the amount to be added is less than the above value, the adhesive has insufficient cross-linking density and is poor in chemical resistance and in heat resistance. When the amount to be added exceeds the above value, the cross-linking density becomes high and renders the adhesive brittle, lowering its bond strength.

The cross-linking agent of the adhesive used in the present invention may also be an organic metal compound having a chelate group. The chelate compound has the following general formula:

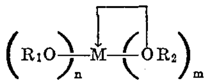

in which M represents a metal atom having a valence of more than one, *n* is an integer including zero, *m* is an integer, $R_1$ is a hydrogen atom, an alkyl group, an unsaturated aliphatic, a hydroxyl group, a ring alkyl group or an aryl group and $R_2$ is an alkyl or aryl group having more than one electron donor atom such as oxygen, nitrogen or sulfur to form a chelate structure. The chelate compounds of the organic metal compound are tetraoctyleneglycol titanate, triethanolaminetitanate diisopropylate, ethylacetoacetate aluminum diisopropylate and methylacetoacetate aluminum dibutoxylate.

The adhesive having mixed therein these chelate compounds is highly stable and can be semicured by suitably selecting the conditions for coating and drying of the adhesive.

The chelate compound having a nitrogen atom as an electron donor atom is particularly effective for reaction with the epoxy group of the low molecular weight epoxy resin. The chelate compounds containing oxygen or sulfur are a little lower in reactivity with the epoxy group, so that a hardener such as boron trifluoride, an amine adduct of $BF_3$, for example, $C_2H_5NH_2 \cdot BF_3$, or

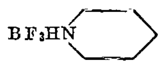

may be used, if necessary. Further, the aforementioned amine resin may also be employed.

The amount of the chelate compound is preferred to range from 5 to 20% by weight with respect to the phenoxy resin and where a hardener is mixed in the compound, the amount of the hardener is 0.1 to 1% by weight relative to the compound.

Supplemented with a ketonic solvent such as acetone, methylethylketone or the like whose carbon number is small, the adhesive of this invention has a lower viscosity. With the addition of such a solvent, a copper clad glass board, which is free from reprint of the copper oxide after etching, can be readily produced by a coating method such as using a knife-coater, which does not apply appreciable shearing force to the treated surface of the copper foil. This is to be compared with laminating the treated copper foil directly on the prepreg without adhesive.

Use of the adhesive of this invention prevents the stain which results from reaction of the copper oxide layer with the impregnated resin. In order to prove this, experiments were conducted in which two adhesive coated copper foils were laminated under the usual conditions for laminating a copper foil on an epoxy resin impregnated glass board, i.e. under a pressure of 40 to 60 kg./cm.[2] and at a temperature of 160 to 180° C. for one hour. An adhesive coated copper foil was laminated on an epoxy glass of G–10 or G–11 grade to provide a copper clad glass board. In both cases, the copper foil was etched with a solution of ferric chloride of 40 Baumé degrees at a temperature of 25 to 30° C. but no stain was found.

The metal clad printed circuit board of this invention has excellent chemical resistance, electric characteristics and adhesion between the metal foil and the glass board. Further, this metal clad glass board is free from reprint of the copper oxide, stain and discoloration.

EXAMPLE 1

Composition of adhesive

| | Parts by weight |
|---|---|
| Phenoxy PAHJ (phenoxy resin manufactured by U.C.C.) | 100 |
| Epon 828 (low molecular epoxy resin manufactured by Shell Chemicals Corp.) | 70 |
| (1) | 10 |

(1)

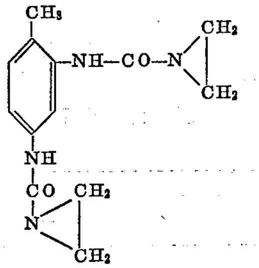

or

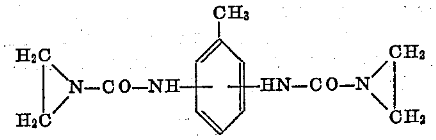

A solution of Phenoxy PAHJ and Epon 828 in methylethylketone is mixed with 20% by weight of solution of the aforementioned cross-linking agent in dimethyl formamide in the above ratio and a solid is adjusted to be 20% by weight with respect to the total amount. The above cross-linking agent is produced by sufficiently stirring a solution of toluene diisocyanate in dehydrated acetone or toluene at 0° C. while dropping ethyleneimine into the solution, in which case the reaction quantitatively proceeds.

The adhesive thus obtained is laid down on a treated electrolytic copper foil T/A (manufactured by Circuit Foil Corporation) and is then treated at normal temperature for two minutes, at 90° C. for two minutes and at 160° C. for four minutes to produce an adhesive coated copper foil with the adhesive being 20 microns in thickness (dry thickness).

Production of prepreg (NEMA G–10 grade)

| | Parts by weight |
|---|---|
| Epikote 1001 (epoxy resin by Shell Chemicals Corp.) | 100 |
| Dicyano diamine | 4 |
| Benzyl dimethyl amine | 0.2 |

Dicyano diamine is dissolved in a solvent containing dimethyl formamide and ethyl Cellosolve in the ratio of 50 to 50 by weight, the amount of dicyano diamine being 20% by weight with respect to the solvent. Epikote 1001, the dicyano diamine solution and benzyl dimethyl amine are dissolved in acetone to adjust the viscosity to about 200 centipoise (cps.).

The resin solution of the above composition is impregnated in a glass cloth treated with a silane coupling agent and is treated at normal temperature for two minutes, at 100° C. for two minutes and at 160° C. for four minutes successively to impregnate the resin in the glass cloth in order to produce a prepreg having about 40% resin.

Then, the adhesive coated copper foil is placed on several sheets of the prepregs and pressed under a pressure of 10 $kg./cm.^2$ at 160° C. for four minutes and then under a pressure of 40 $kg./cm.^2$ at 160° C. for one hour to provide a copper clad glass board having a thickness of 1.6 mm. The characteristics of the copper clad glass board thus produced are shown in Table 1.

EXAMPLE 2

| | Parts by weight |
|---|---|
| Phenoxy PAHJ (phenoxy resin by U.C.C.) | 100 |
| DEN 431 (low molecular epoxy resin by Dow Chemicals Corp.) | 50 |
| (1) | 7 |

(1)

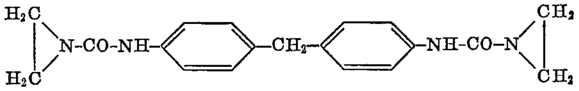

An adhesive similar to that in Example 1 is produced by using the above materials and an adhesive coated, electrolytic copper foil is produced under the same conditions as those in Example 1. The above cross-linking agent is produced by using diphenylmethanediisocyanate as a starting material under conditions similar to those employed in Example 1.

| | Parts by weight |
|---|---|
| Epikote 1001 | 100 |
| Epikote 154 (epoxy resin by Shell Chemicals Corp.) | 100 |
| Diaminodiphenylsulfone (hardener) | 30 |
| $BF_3$ 400 (hardener by Shell Chemicals Corp.) | 1.5 |

The above materials are dissolved in methylethylketone and the viscosity is adjusted to about 200 centipoise (cps.). Epoxy resin impregnated glass cloths are produced using this solution under the same conditions as those in Example 1 to provide a prepreg of NEMA G–11 grade.

The above adhesive coated copper foil is placed on several sheets of the prepregs and pressed on the latter under a pressure of 10 $kg./cm.^2$ at 160° C. for four minutes and then under a pressure of 70 $kg./cm.^2$ at 180° C. for one hour, thus producing a copper clad glass board. The characteristics of this board are shown in Table 1.

EXAMPLE 3

| | Parts by weight |
|---|---|
| DER 488 N–40 (phenoxy resin by Dow Chemicals Corp.) (solid 40%) | 400 |
| DER 511 (low molecular epoxy resin by Dow Chemicals Corp.) | 50 |
| (1) | 50 |

(1)

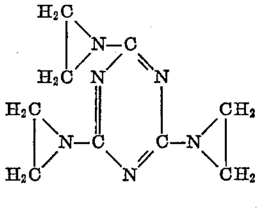

The cross-linking agent is dissolved in dimethyl formamide and the resulting solution is mixed with a solution of the above resin in methylethylketone to produce an adhesive having a solid component in the ratio of 20% with respect to the total amount of the mixture. An adhesive coated copper foil is produced using the adhesive under the same conditions employed in Example 1.

The preparation of the above cross-linking agent is achieved in the following manner. Cyanuryl chloride is dissolved in dioxane ant suspended in ice water and the suspension is held at 0 to 2° C. An aqueous solution of ethyeneimine and calcium carbonate is dropped into the suspension for an hour while stirring, after which the solution is further stirred at 1° C. for twenty minutes to terminate the reaction. The reactant is decolored with an active carbon powder and filtered and the filtrate is extracted with chloroform to obtain the desired substance.

| | Parts by weight |
|---|---|
| DER 511 (epoxy resin by Dow Chemicals Corp.) | 100 |
| DER 611 (epoxy resin by Dow Chemicals Corp.) | 50 |
| Dicyano diamine | 4 |
| Benzyl dimethyl amine | 0.3 |

Dicyano diamine is dissolved in a solution containing dimethyl formamide and ethyl Cellosolve in the ratio of 50 to 50 by weight and the above components are dissolved in acetone and the viscosity is adjusted to approximately 200 centipoise (cps.). Epoxy resin impregnated glass cloths are produced with the above solution under similar conditions to those in Example 1 to provide a prepreg of NEMA FR-4 grade.

Then, the adhesive coated copper foil is placed on several sheets of the prepregs and pressed thereon under a pressure of 10 kg./cm.$^2$ at 175° C. for two minutes and then under a pressure of 35 kg./cm.$^2$ at 175° C. for an hour to produce a copper clad glass board. The characteristics of the board thus produced are shown in Table 1.

EXAMPLE 4

| | Parts by weight |
|---|---|
| Araldite 684 EK-40 (solid 40%) (phenoxy resin by Chiba) | 400 |
| DER 580 (low molecular epoxy resin by Dow Chemicals Corp.) | 40 |
| APO (cross-linking agent by Sogo Yakuko) | 5 |

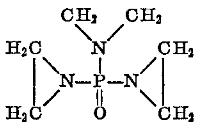

| | |
|---|---|
| Beckamine J820 (amine resin by Dai Nippon Ink & Chemicals Inc.) | 5 |

The above components are used and the other conditions are the same as those in Example 1 to produce an adhesive coated copper foil.

| | Parts by weight |
|---|---|
| Epikote 1045-A-70 (epoxy resin by Shell Chemicals Corp.) | 75 |
| Epikote 154 (epoxy resin by Shell Chemicals Corp.) | 25 |
| Diaminodiphenylsulfone | 15 |
| $BF_3$ 400 (hardener by Shell Chemicals Corp.) | 0.8 |

A prepreg of NEMA FR-5 grade is produced in the same manner as that in Example 1 except that an epoxy resin solution of the above components in 90 parts by weight of methylethylketone is treated at normal temperature for two minutes, at 90° C. for two minutes and at 130° C. for five minutes.

The aforementioned adhesive coated copper foil is pressed on several sheets of the prepregs under a pressure of 10 kg./cm.$^2$ at 160° C. for four minutes and then under a pressure of 40 kg./cm.$^2$ at 180° C. for an hour to produce a copper clad glass board. The characteristics of the board thus obtained are shown in Table 1.

EXAMPLE 5

| | Parts by weight |
|---|---|
| Phenoxy PAHJ | 100 |
| Epon 828 | 50 |
| Tyzor TE (chelate compound by Du Pont) | 5 |

A copper clad glass board is made in the same manner as in Example 1 except that the above components are dissolved in methylethylketone to produce an adhesive containing a solid component of 20%. The characteristics of the glass board thus obtained are shown in Table 2.

EXAMPLE 6

| | Parts by weight |
|---|---|
| Phenoxy PAHJ | 100 |
| Epon 828 | 50 |
| Tyzor AA (chelate compound by Du Pont) | 5 |
| $BF_3 \cdot NH_2C_2H_5$ | 0.3 |

A copper clad glass board is produced in the same manner as in Example 1 except that the above components are dissolved in methylethylketone to provide an adhesive having a solid component of 20%. The characteristics of the glass board thus obtained are shown in Table 2.

EXAMPLE 7

| | Parts by weight |
|---|---|
| Phenoxy PAHJ | 100 |
| Epon 828 | 50 |
| Methylacetate aluminum butoxylate | 5 |
| $BF_3 \cdot NH_2C_2H_5$ | 0.3 |
| Beckamine J820 (amine resin by Dai Nippon Ink & Chemicals Inc.) | 5 |

A copper clad glass board is produced in the same manner as in Example 1 except that an adhesive is made from the above components. The characteristics of the glass board are shown in Table 2.

EXAMPLE 8

| | Parts by weight |
|---|---|
| Epikote OL-55-B-40 (epoxy resin by Shell Chemicals Corp.) (solid component 40%) | 400 |
| Epon 828 | 40 |
| (1) | 10 |
| Beckamine J820 (amine resin by Dai Nippon Ink & Chemicals Inc.) | 5 |

(1)

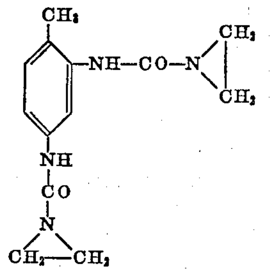

The above components are dissolved in methylethylketone to obtain an adhesive containing a solid component in the ratio of 20% by weight with respect to the methylethylketone. This adhesive is coated 25 microns thick on a polypropylene laminated paper and held at normal temperature for two minutes, at 90° C. for two minutes and then at 140° C. for four minutes. The coated adhesive is peeled off from the laminated paper and pressed between a copper foil and a prepreg under the same conditions employed in Example 1, thus obtaining a copper clad glass board. The characteristics of the board are shown in Table 1.

TABLE 1

| Copper clad glass board | Peel strength (kg./cm.) Normal condition | After soaked in solder at 260° C. for 3 minutes | After soaked in 10% KCN solution at 70° C for 30 minutes | After heated at 140° C. for 7 days | After treated with boiled trichloroethylene for one hour | Surface insulation resistance (MΩ) | Treatment with sulfuric-chromic acid mixture |
|---|---|---|---|---|---|---|---|
| Example 1 Adhesive not used | 1.66 | 1.55 | 1.60 | 1.65 | 1.54 | Higher than $10^5$ | Insoluble. |
| Conventional sample A adhesive not used | 1.75 | 1.59 | 1.55 | 1.48 | 1.73 | do | Do. |
| Conventional sample B adhesive not used | 1.58 | 1.54 | 1.28 | 1.50 | 1.55 | do | Do. |
| Butyrol phenol system adhesive used | 2.15 | 1.90 | 1.76 | 1.80 | 1.89 | do | Soluble. |
| Example: | | | | | | | |
| 1 | 2.38 | 2.17 | 2.20 | 2.25 | 2.17 | do | Insoluble. |
| 2 | 2.06 | 2.02 | 2.01 | 2.02 | 2.17 | do | Do. |
| 3 | 2.31 | 2.05 | 2.02 | 2.10 | 2.32 | do | Do. |
| 4 | 2.50 | 2.20 | 2.00 | 2.15 | 2.57 | do | Do. |
| 8 | 2.42 | 2.20 | 2.30 | 2.30 | 2.42 | do | Do. |

The surface insulation resistances were measured under the conditions JIS C–96/35/90 and in the treatment with sulfuric-chromic acid mixture were treated with a solution of 400 g./l. of $CrO_3$ in 70 g./l. of concentrated sulfuric acid at 50° C. for 15 minutes. The other items for testing were determined with reference to the standards such as MIL, NEMA and JIS.

TABLE 2

| Copper clad glass board | Peel strength (kg./cm.) Normal condition | After soaked in solder at 260° C. for 3 minutes | After soaked in 10% KCL solution at 70° C. for 30 minutes | After heated at 140° C. for 7 days | After treated with boiled trichloroethylene | Surface insulation resistance (MΩ) | Treatment with sulfuric-chromic acid mixture |
|---|---|---|---|---|---|---|---|
| Example: | | | | | | | |
| 5 | 2.17 | 1.90 | 1.90 | 2.05 | 2.10 | Higher than $10^5$ | Insoluble. |
| 6 | 2.36 | 1.95 | 1.84 | 2.34 | 2.30 | do | Do. |
| 7 | 2.26 | 1.85 | 2.00 | 2.22 | 2.22 | do | Do. |

EXAMPLE 9

Composition of adhesive

| | Parts by weight |
|---|---|
| Phenoxy PAHJ | 100 |
| Epon 828 | 70 |
| (1) | 10 |

(1)

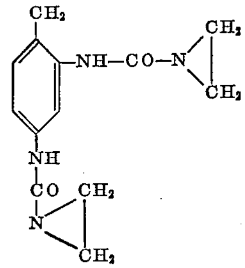

The adhesive is produced by the same operation as in Example 1. An aluminum foil of JIS AlPl—1/2H grade, 50 microns in thickness and an aluminum plate of JIS AlPl grade, 2 mm. in thickness, were soaked in sulfuric-chromic acid mixture containing $CrO_3$, $H_2SO_4$ and $H_2O$ in the ratio of 1:5:15 by weight and heated up to 70° C. to oxidize the surface of the aluminum plate. Two aluminum plates thus treated were coated with the above adhesive and held at room temperature for two minutes, thereafter being heated at 90° C. for two minutes and then at 140° C. for four minutes to semicure the adhesive. The semicured adhesive layer was 25 microns. These two aluminum plates were placed one on the other and pressed under a pressure of 10 kg./cm.$^2$ at 160° C. for 30 minutes to provide a Sample 1 for measuring shear strength.

Then, an aluminum plate and an aluminum foil were coated with the adhesive in the same manner as that above described and then similarly bonded together to obtain a Sample 2 for measuring peel strength.

For comparing the adhesive of this invention with conventional epoxy resin adhesive, two aluminum plates were bonded together by an epoxy resin adhesive, "Bond master" M666 (Sony Chemicals Corp.), at 121° C. for 30 minutes to obtain a Sample 3 with the adhesive layer being 50 microns thick for measuring shear strength, and an aluminum foil was pressed on an aluminum plate under similar conditions to obtain a Sample 4 for measuring peel strength.

The measured values of the samples are given in the following table.

| | Shear strength (kg./cm.$^2$) | | | | Peel strength (kg./cm.) | | | |
|---|---|---|---|---|---|---|---|---|
| | −30° C. | 25° C. | 60° C. | 100° C. | −30° C. | 25° C. | 60° C. | 100° C. |
| Adhesive of this invention | 293 | 255 | 251 | 171 | 2.16 | 2.10 | 2.16 | 1.85 |
| Conventional adhesive | 287 | 253 | 35 | 12.0 | 1.4 | 1.36 | 1.07 | 0.72 |

As is apparent from the above data, the adhesive of this invention is very superior in peel strength compared to the conventional adhesive, and also has excellent shear strength at high temperature. The adhesive withstands use even at 100° C. The adhesive of the present invention is most suitable as a structural adhesive which can be used at high temperature. Similar samples were tested for their resistance to chemicals such as chromic acid, ammonium persulfate, potassium cyanide, trichloroethylene and so on and water resistance but the bond strength did not decrease. The conventional epoxy adhesive had no resistance to trichloroethylene.

It will be apparent that many modifications and variations may be effected without departing from the scope of the novel concepts of this invention.

What is claimed is:

1. A printed circuit board consisting essentially of an epoxy resin impregnated, glass fiber board and a metal foil laminated on said board with an adhesive composition which comprises: a synthetic resin having the formula

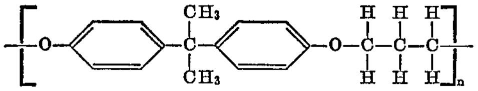

wherein $n$ is 50 to 100, said resin having an epoxy value lower than 4000, and a cross-linking agent selected from the group consisting of (1) a cross-linking agent having at least two aziridine rings at the ends of the molecules thereof, and (2) a cross-linking agent having the formula:

wherein M is a metal atom having a valence of at least one, $n$ is an integer including zero, $m$ is an integer, $R_1$ is a member selected from the group consisting of hydrogen atom, alkyl, unsaturated aliphatic, cyclic alkyl and aryl, and $R_2$ is a member selected from the group consisting of alkyl and aryl which has at least one electron donor atom, to form a chelate with said metal atom.

2. A printed circuit board as claimed in claim 1, wherein said cross-linking agent (1) has the following formula:

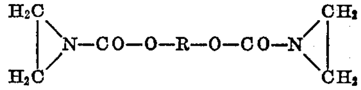

3. A printed circuit board as claimed in claim 2, wherein R is aliphatic.

4. A printed circiut board as claimed in claim 2, wherein R is aromatic.

5. A printed circuit board as claimed in claim 4, wherein said cross-linking agent (1) has the following formula:

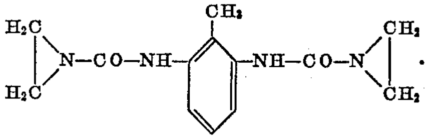

6. A printed circuit board as claimed in claim 4, wherein said cross-linking agent (1) has the following formula:

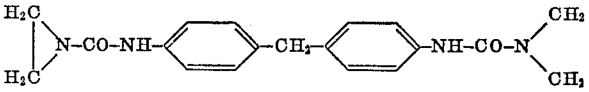

References Cited

UNITED STATES PATENTS 3,388,036 6/1968 Alampi ............ 161—185

WILLIAM A. POWELL, Primary Examiner

U.S. Cl. X.R.

156—330; 161—93, 186, 196, 216